(12) United States Patent
Nath et al.

(10) Patent No.: US 8,924,029 B2
(45) Date of Patent: Dec. 30, 2014

(54) APPARATUS AND METHOD FOR INCREASING THE ULTIMATE RECOVERY OF NATURAL GAS CONTAINED IN SHALE AND OTHER TIGHT GAS RESERVOIRS

(75) Inventors: Ravi Nath, Houston, TX (US); Sanjay Kumar Sharma, Houston, TX (US); Jeffrey G. Renfro, Deer Park, TX (US); Jerome J. Stanek, Houston, TX (US); Betty Jean Stanek, legal representative, Houston, TX (US)

(73) Assignee: Honeywell International Inc., Morristown, NJ (US)

( * ) Notice: Subject to any disclaimer, the term of this patent is extended or adjusted under 35 U.S.C. 154(b) by 410 days.

(21) Appl. No.: 13/295,746

(22) Filed: Nov. 14, 2011

(65) Prior Publication Data

US 2012/0215365 A1 Aug. 23, 2012

Related U.S. Application Data

(60) Provisional application No. 61/445,848, filed on Feb. 23, 2011.

(51) Int. Cl.
| | | |
|---|---|---|
| G06F 19/00 | (2011.01) | |
| E21B 43/34 | (2006.01) | |
| G05B 13/04 | (2006.01) | |
| E21B 43/00 | (2006.01) | |
| E21B 43/26 | (2006.01) | |
| E21B 44/00 | (2006.01) | |

(52) U.S. Cl.
CPC ............... E21B 43/34 (2013.01); G05B 13/04 (2013.01); E21B 43/00 (2013.01); E21B 43/26 (2013.01); E21B 44/00 (2013.01)
USPC ................ 700/282; 703/10; 702/45; 702/48; 166/386; 166/344; 166/320

(58) Field of Classification Search
CPC ....... E21B 43/00; E21B 43/12; E21B 43/121; E21B 43/25; G06F 17/00; G05B 13/00; G05B 17/00
USPC .......... 700/282, 285; 166/386, 316, 266, 344, 166/320; 702/45–49; 703/10
See application file for complete search history.

(56) References Cited

U.S. PATENT DOCUMENTS

| | | | |
|---|---|---|---|
| 4,685,522 A | 8/1987 | Dixon et al. | |
| 5,983,164 A * | 11/1999 | Ocondi | ........................... 702/12 |

(Continued)

FOREIGN PATENT DOCUMENTS

| | | |
|---|---|---|
| WO | WO 00/00715 A1 | 1/2000 |
| WO | WO 2004/038535 A2 | 5/2004 |

(Continued)

OTHER PUBLICATIONS

K. K. Lo, "Optimum Lift-Gas Allocations Under Multiple Production Constraints", Society of Petroleum Engineers, vol. SPE, No. 26017, Dec. 7, 1992, pp. 1-23.

(Continued)

*Primary Examiner* — Michael D Masinick

(57) ABSTRACT

A method includes obtaining a model associated with production of natural gas from a well, where the well has a choke valve that controls flow of material including natural gas from the well. The method also includes identifying, using the model, a solution that increases an amount of natural gas obtained from the well over a specified time horizon. In addition, the method includes adjusting operation of the choke valve based on the identified solution. The model could be generated using geological data associated with the well and/or historical data associated with natural gas production from the well. A natural gas reservoir can be modeled as a continuous stirred bed with a rock or shale void fraction using mass or volumetric unit balances. Gas content versus pressure for the well can be plotted, and Langmuir adsorption parameters for the well can be identified using the plotted gas content versus pressure.

20 Claims, 5 Drawing Sheets

(56) References Cited

U.S. PATENT DOCUMENTS

| | | | |
|---|---|---|---|
| 6,434,435 | B1 | 8/2002 | Tubel et al. |
| 6,435,216 | B2 * | 8/2002 | McCulloch ............... 138/42 |
| 6,454,002 | B1 | 9/2002 | Stokes et al. |
| 6,611,735 | B1 | 8/2003 | Henly et al. |
| 6,758,277 | B2 | 7/2004 | Vinegar et al. |
| 6,941,254 | B2 * | 9/2005 | Duret et al. ............... 703/9 |
| 7,500,370 | B2 * | 3/2009 | Coward ............... 62/657 |
| 8,170,801 | B2 * | 5/2012 | Foot et al. ............... 702/12 |
| 8,290,632 | B2 * | 10/2012 | Briers et al. ............... 700/282 |
| 8,412,458 | B2 * | 4/2013 | Foot et al. ............... 702/12 |
| 2002/0049575 | A1 * | 4/2002 | Jalali et al. ............... 703/10 |
| 2003/0097243 | A1 | 5/2003 | Mays et al. |
| 2004/0040746 | A1 * | 3/2004 | Niedermayr et al. ............... 175/38 |
| 2004/0216514 | A1 | 11/2004 | Nunnally et al. |
| 2005/0149307 | A1 * | 7/2005 | Gurpinar et al. ............... 703/10 |
| 2005/0199391 | A1 | 9/2005 | Cudmore et al. |
| 2005/0284176 | A1 | 12/2005 | Eaton et al. |
| 2007/0227187 | A1 | 10/2007 | Coward |
| 2007/0276542 | A1 | 11/2007 | Coward |
| 2008/0234939 | A1 * | 9/2008 | Foot et al. ............... 702/12 |
| 2010/0023269 | A1 * | 1/2010 | Yusti et al. ............... 702/12 |
| 2010/0217575 | A1 | 8/2010 | Briers et al. |
| 2011/0042592 | A1 * | 2/2011 | Elliott et al. ............... 251/120 |

FOREIGN PATENT DOCUMENTS

| | | |
|---|---|---|
| WO | WO 2004/070569 A2 | 8/2004 |
| WO | WO 2010/099623 | 9/2010 |

OTHER PUBLICATIONS

Palke, Miles R., et al., "Nonlinear Optimization of Well Production Considering Gas Lift and Phase Behavior", Society of Petroleum Engineers, SPE Production Operation Symposium, SPE 37428, Mar. 1997, pp. 1-16.

L. Saputelli, et al., "Self-Learning Reservoir Management", SPE, Reservoir Evaluation & Engineering, vol. SPE, No. 84064, Dec. 2005, pp. 534-547.

B. Stenhouse, "Learnings on Sustainable Model-Based Optimisation-The Valhall Optimiser Field Trial", Society of Petroleum Engineers, vol. SPE, No. 998282, Apr. 13, 2006, pp. 1-15.

L.A. Saputelli, et al., "Promoting Real-Time Optimization of Hydrocarbon Producing Systems", EPE Annual Technical Conference and Exhibition, vol. SPE, No. 83978, Sep. 2, 2003, pp. 1-9.

International Search Report dated Oct. 24, 2007 in connection with International Patent Application No. PCT/US2007/069536.

Written Opinion of the International Searching Authority dated Oct. 24, 2007 in connection with International Patent Application No. PCT/US2007/069536.

Brian A. Coward, "System and Method for Multivariable Control in Three-Phase Separation Oil and Gas Production", U.S. Appl. No. 11/441,429, filed May 25, 2006.

Notification of Transmittal of the International Search Report and the Written Opinion of the International Searching Authority, or the Declaration dated Sep. 17, 2012 in connection with International Patent Application No. PCT/US2012/026000.

* cited by examiner

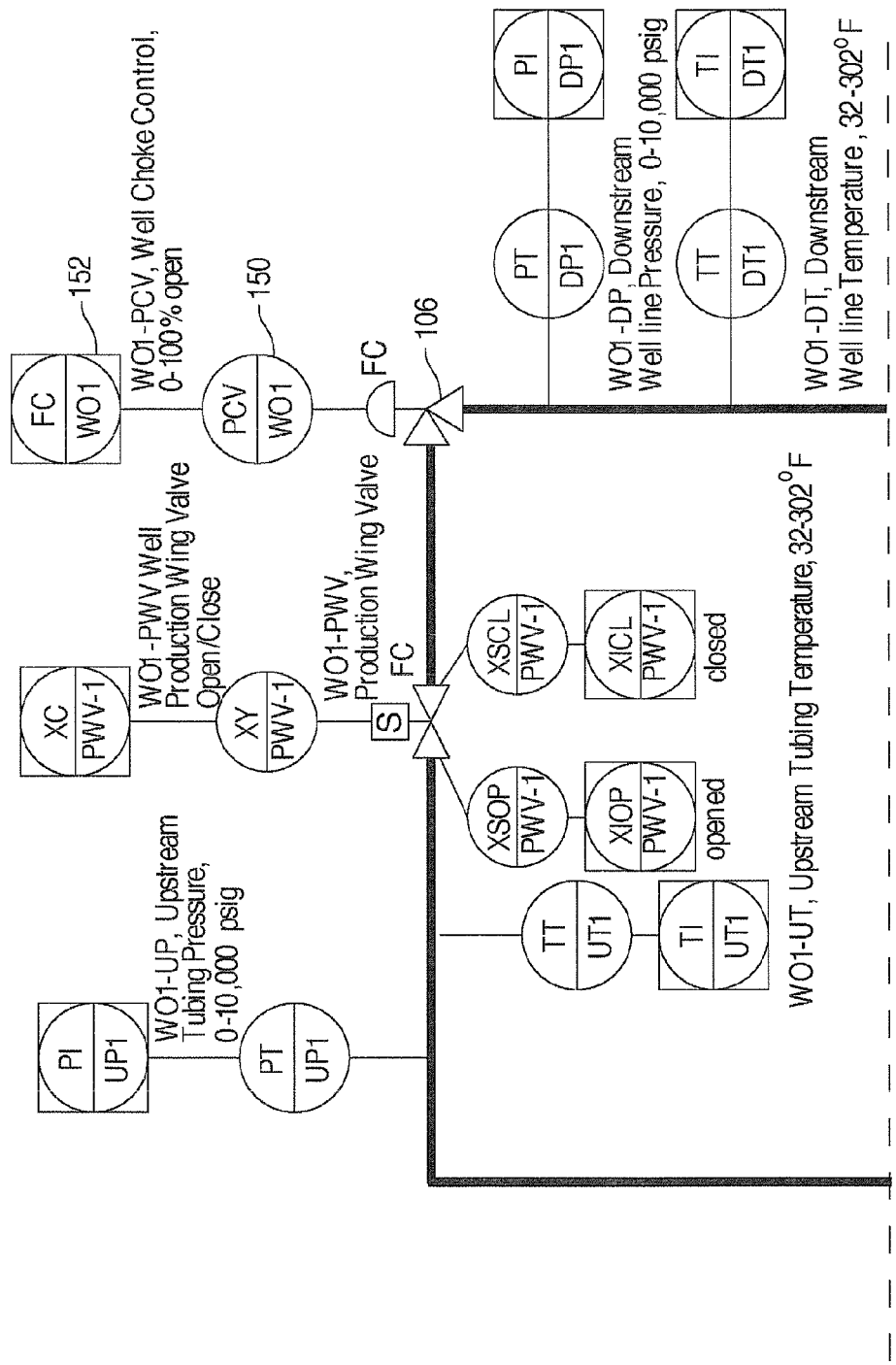
FIG. 1B(1)

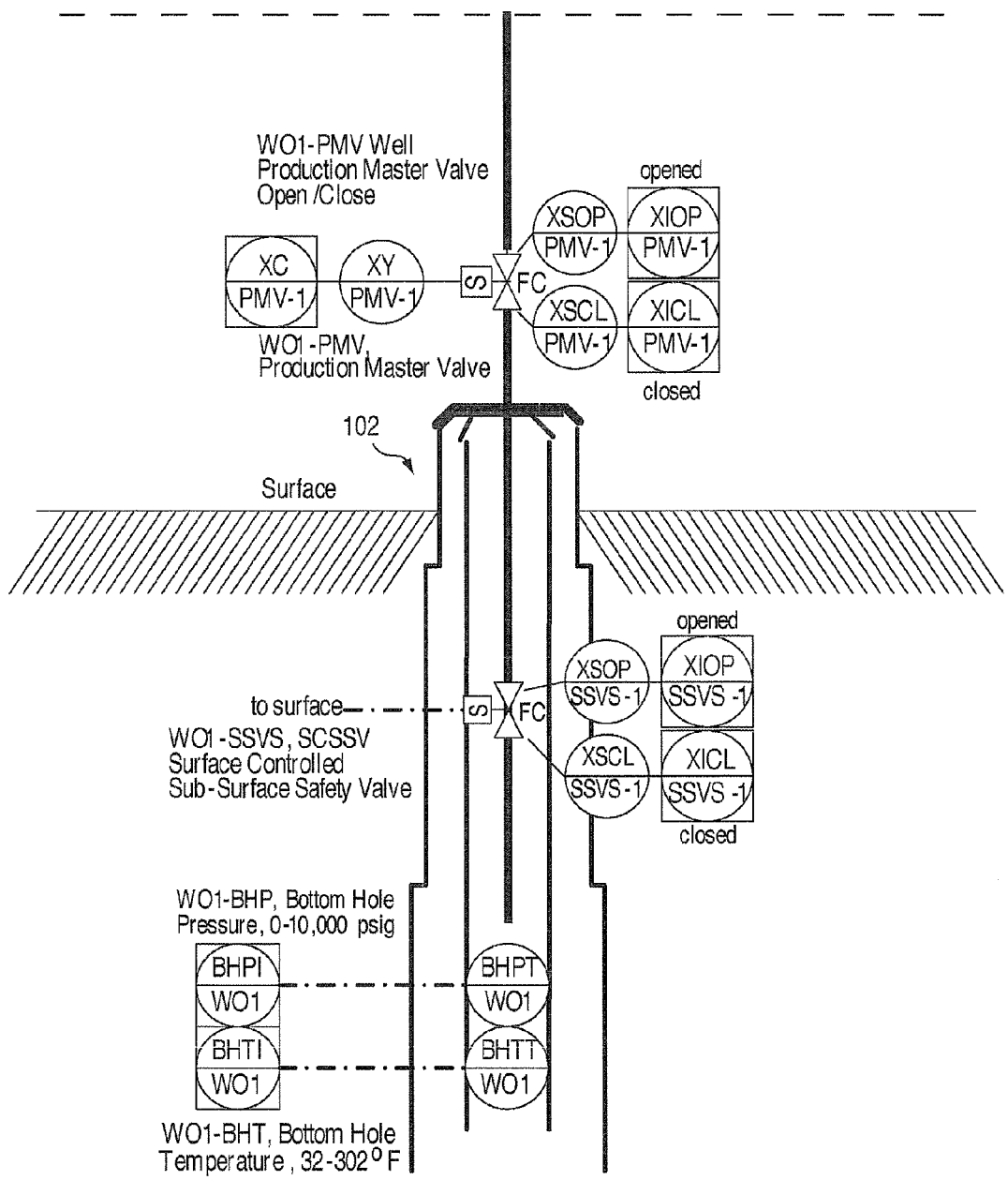
FIG. 1B(2)

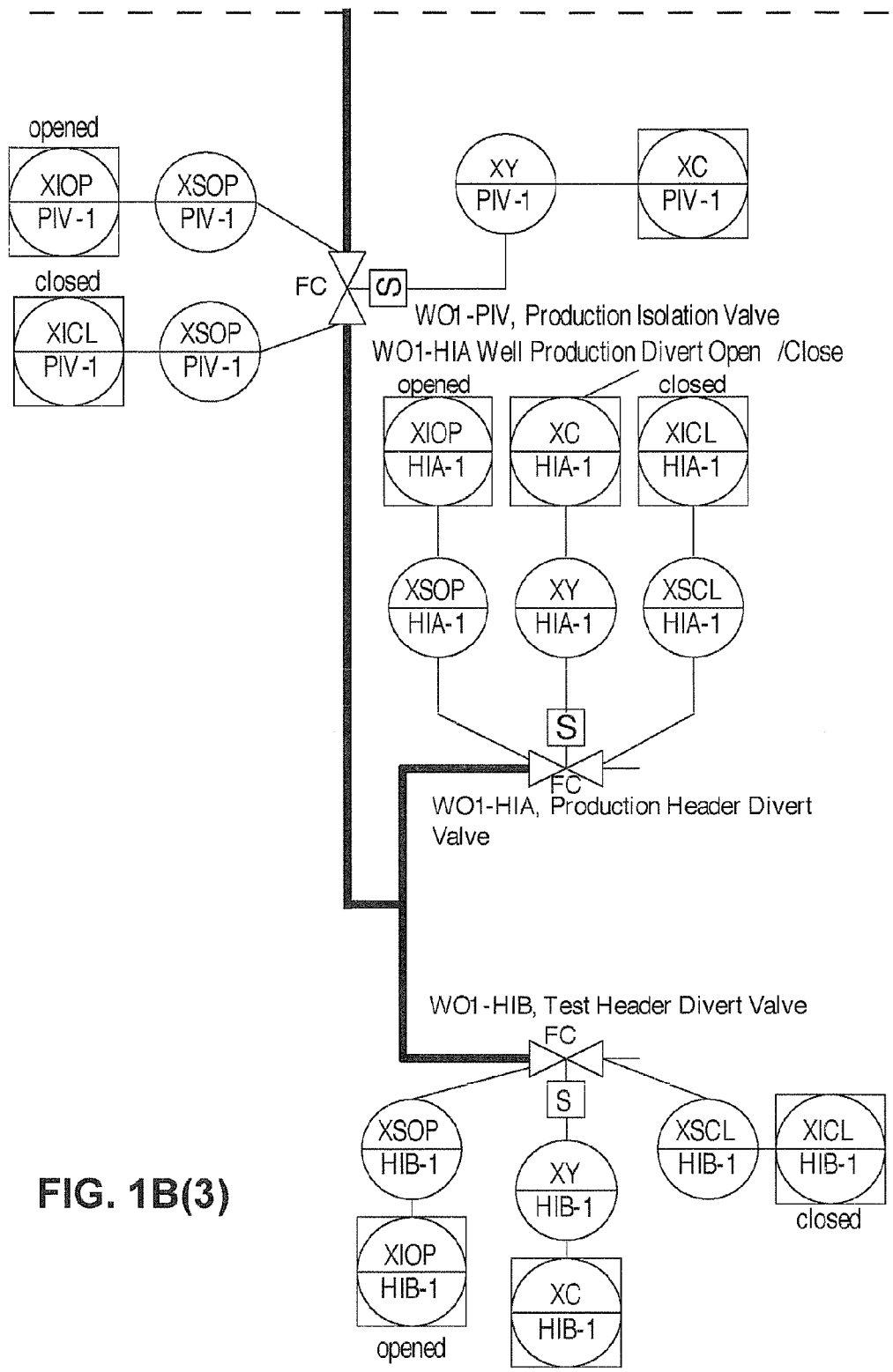
FIG. 1B(3)

APPARATUS AND METHOD FOR INCREASING THE ULTIMATE RECOVERY OF NATURAL GAS CONTAINED IN SHALE AND OTHER TIGHT GAS RESERVOIRS

CROSS-REFERENCE TO RELATED APPLICATION AND PRIORITY CLAIM

This application claims priority under 35 U.S.C. §119(e) to U.S. Provisional Application No. 61/445,848 filed on Feb. 23, 2011, which is hereby incorporated by reference.

TECHNICAL FIELD

This disclosure relates generally to control systems. More specifically, this disclosure relates to an apparatus and method for increasing the ultimate recovery of natural gas contained in shale and other tight gas reservoirs.

BACKGROUND

Shale gas extraction from gas-rich shale areas deep underground is an emerging "unconventional" source of natural gas. Shale gas areas are often known as "resource plays," meaning the geological chance of finding natural gas is high but the potential profit per successful well is usually low. This is in contrast to "exploration plays," where the geological chance of finding natural gas is low but the potential profit per successful well is usually high. Shale deposits also typically have low porosity and permeability, so shale gas production in commercial quantities often requires both expensive hydro-fracturing of shale formations and the drilling of a large number of wells in a field. For these and other reasons, the production of shale gas is challenging both technically and commercially.

SUMMARY

This disclosure provides an apparatus and method for increasing the ultimate recovery of natural gas contained in shale and other tight gas reservoirs.

In a first embodiment, a method includes obtaining a model associated with production of natural gas from a well, where the well has a choke valve that controls flow of material including natural gas from the well. The method also includes identifying, using the model, a solution that increases an amount of natural gas obtained from the well over a specified time horizon. In addition, the method includes adjusting operation of the choke valve based on the identified solution.

In a second embodiment, an apparatus includes at least one memory unit configured to store a model associated with production of natural gas from a well that has a choke valve for controlling flow of material including natural gas from the well. The apparatus also includes at least one processing unit configured to identify, using the model, a solution that increases an amount of natural gas obtained from the well over a specified time horizon and adjust operation of the choke valve based on the identified solution.

In a third embodiment, a computer readable medium embodies a computer program. The computer program includes computer readable program code for obtaining a model associated with production of natural gas from a well having a choke valve that controls flow of material including natural gas from the well. The computer program also includes computer readable program code for identifying, using the model, a solution that increases an amount of natural gas obtained from the well over a specified time horizon. In addition, the computer program includes computer readable program code for adjusting operation of the choke valve based on the identified solution.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 1A and 1B (FIGS. 1B(1)-1B(3)) illustrate an example oil and gas production system according to this disclosure;

DETAILED DESCRIPTION

Figure 1A:
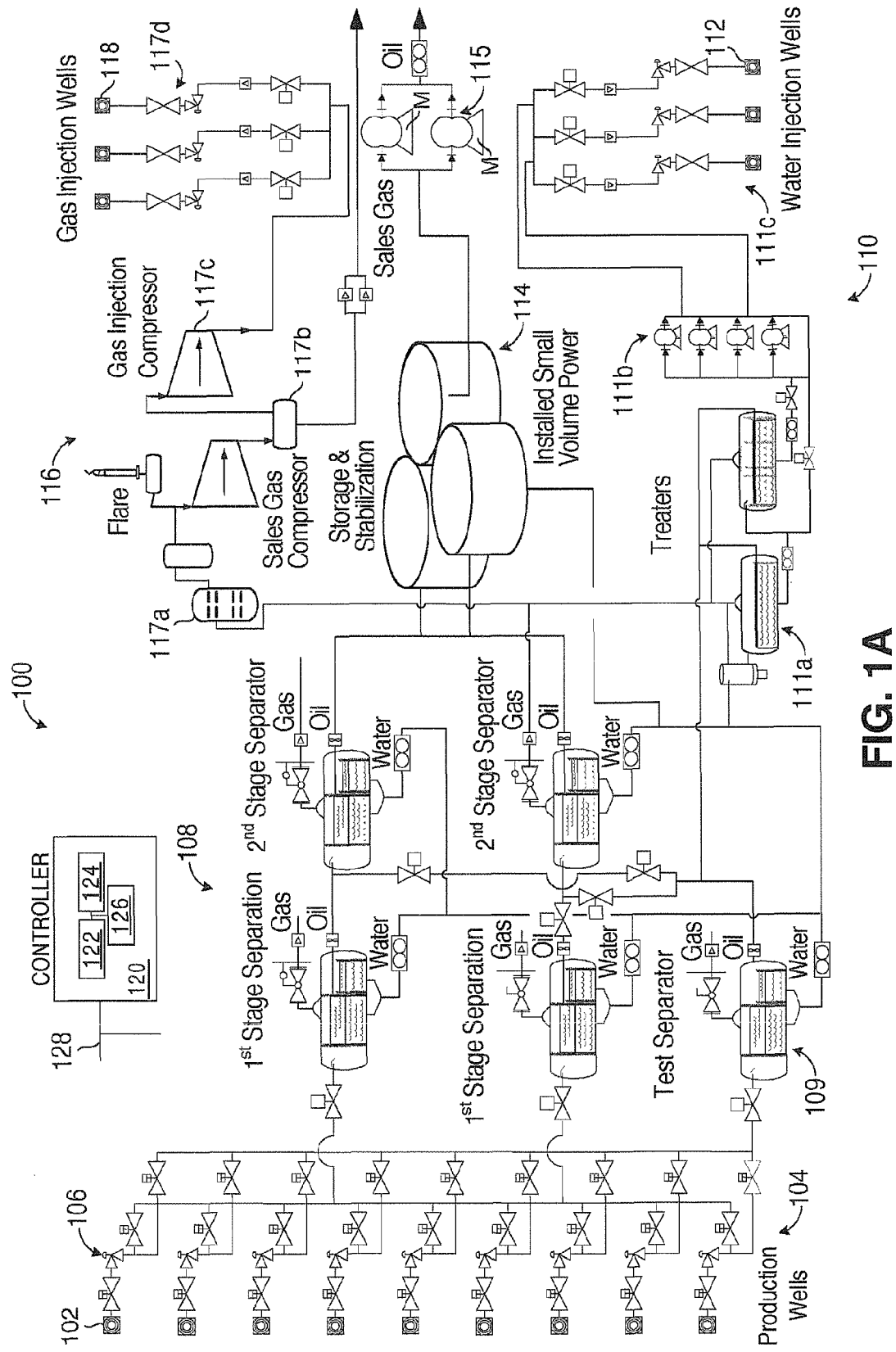
Figure 2:
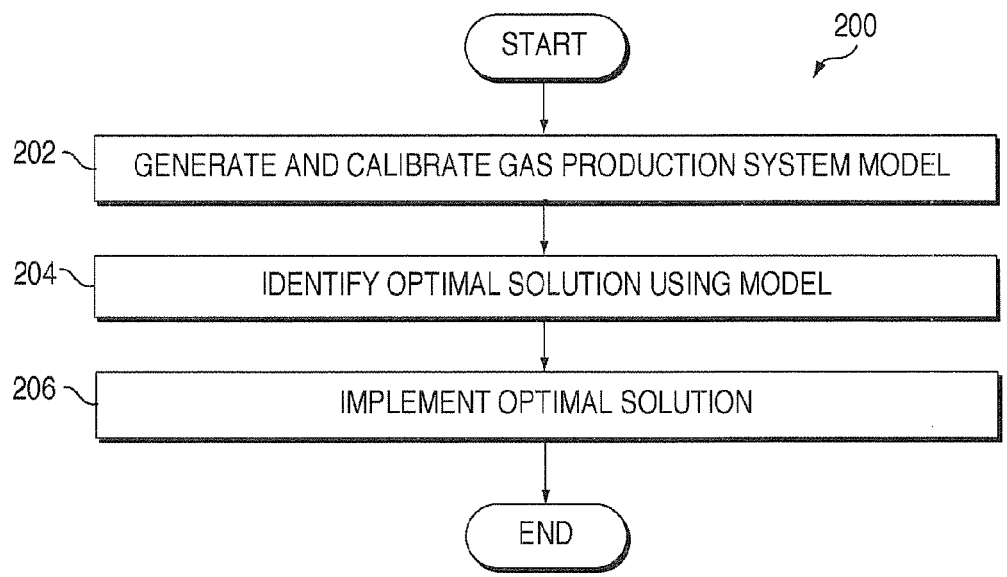
FIG. 2 illustrates an example method for increasing recovery of natural gas according to this disclosure.
Figure 3:
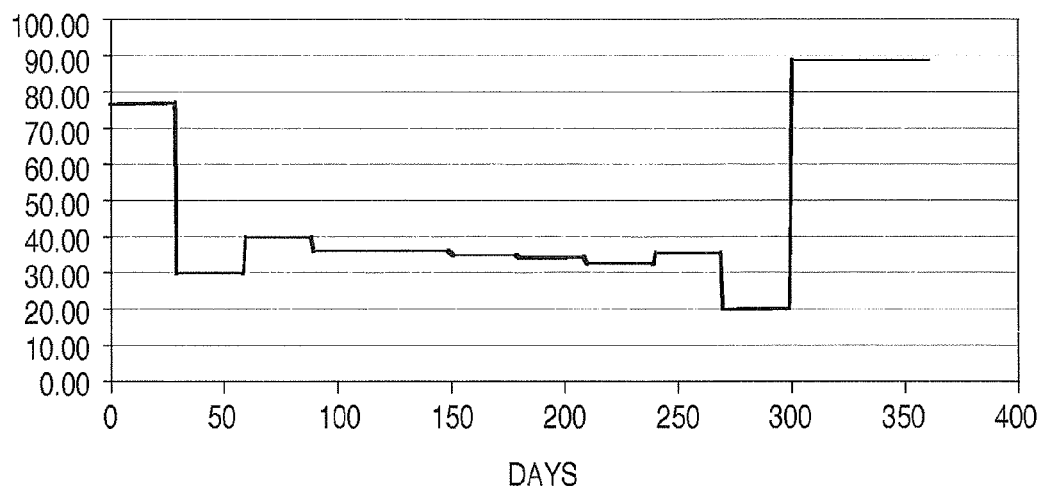
FIG. 3 illustrates an example graph plotting choke valve position over time according to this disclosure.

FIGS. 1 through 3, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

FIGS. 1A and 1B (FIGS. 1B(1)-1B(3)) illustrate an example oil and gas production system 100 according to this disclosure. The embodiment of the production system 100 shown in FIGS. 1A and 1B is for illustration only. Other embodiments of the production system 100 could be used without departing from the scope of this disclosure. For example, while FIGS. 1A and 1B may illustrate one example of an oil and gas production system, a system for producing substantially only natural gas could also be used.

As shown in FIG. 1A, the production system 100 includes or is associated with a number of production wells 102. The production wells 102 denote wells from which material (including natural gas) is extracted from the ground and processed. Any suitable number and arrangement of production wells 102 could be used. For example, the production wells 102 may be widely spaced and feed material into a central processing facility. The production wells 102 may also be grouped together on a well pad (such as in groups of eight or sixteen wells) and feed material into a processing facility.

A network of valves 104 controls the extraction of material from the production wells 102 and the delivery of the extracted material to processing equipment. The network of valves 104 includes a surface choke valve 106 for each of the production wells 102. Each choke valve 106 controls the flow of material including natural gas from an associated production well 102.

In this example, material extracted from the production wells 102 is processed within a separator section 108 of the production system 100. In this particular embodiment, the separator section 108 includes a number of separators 109 arranged in multiple stages. The separators 109 operate to separate material into its constituent parts. For example, the separators 109 can be used to roughly divide the extracted material into water, oil, and natural gas. The water can be provided to a treatment section 110, which treats the water prior to reinjection into the ground via one or more water injection wells 112. The treatment section 110 includes various separators 111a, pumps 111b, valves 111c, and various other equipment. Oil extracted from the production wells 102 can be stored in one or more storage tanks 114. The oil can then be output and sold via pumps 115 or otherwise used.

Natural gas extracted from the production wells 102 can be processed using equipment in a natural gas processing section 116. The equipment could include heat exchangers 117a, separators 117b, compressors 117c, and valves 117d. Some of the gas can be reinjected into the ground via one or more gas injection wells 118. The remaining gas can be output sold or otherwise used.

FIG. 1B (FIGS. 1B(1)-1B(3)) illustrates additional details regarding a single production well 102. As shown in FIGS. 1B(1)-1B(3), a production well 102 is often associated with a number of different process variables, which are represented by circles in FIGS. 1B(1)-1B(3). Process variables denote different characteristics associated with the production system 100. Process variables are often classified as manipulated variables (MVs), controlled variables (CVs), and disturbance variables (DVs). A manipulated variable generally denotes a process variable that can be adjusted. A controlled variable generally denotes a process variable that is measured and controlled (through changes to one or more manipulated variables) so that the controlled variable is maintained at a specified value or within specified limits. An example of this is when an amount of valve opening (a manipulated variable) is used to control a flow rate (a controlled variable). A disturbance variable generally denotes a variable that can affect a controlled variable and that can be considered but not controlled, such as ambient temperature or atmospheric pressure.

A process variable often has at least one associated piece of equipment. For example, a sensor can be used to measure a controlled or disturbance variable, and an actuator can be used to adjust a manipulated variable. The sensors, actuators, and other equipment are generally represented by squares containing circles in FIGS. 1B(1)-1B(3). In this example, the choke valve 106 is associated with a process variable 150, which represents the amount that the choke valve 106 is opened or closed. The choke valve 106 can be controlled using a valve actuator 152, which can adjust the opening or closing of the choke valve 106.

As noted above, shale gas extraction or the extraction of natural gas from other tight reservoirs can be challenging both technically and commercially. This disclosure provides a technique for monitoring natural gas extraction equipment and making timely adjustments to one or more choke valve settings. Among other things, this can help to increase or maximize the ultimate recovery of natural gas from one or more wells in a shale gas field or other tight reservoir.

In accordance with this disclosure, at least one controller 120 is used to control the operation of one or more choke valves 106 associated with one or more wells 102. In conventional systems, choke valves are often operated in their fully-opened or otherwise fixed positions. While this may increase initial production of natural gas from a tight reservoir, it typically reduces the total ultimate recovery from a field. The controller(s) 120 can be used with a model of a production system and dynamically adjust one or more choke valves 106 to help increase or maximize the production of natural gas from one or more wells 102.

Any suitable control technology can be used by the controller(s) 120 to control operation of one or more choke valves 106. For example, the controller(s) 120 could implement model predictive control (MPC) techniques and use non-linear models to predict the behavior of a well 102 and control its choke valve 106. As particular examples, the controller(s) 120 could be implemented using one or more RC500 RTU, EXPERION, EXPERION LITE, PROFIT, or PROFIT NON-LINEAR CONTROLLER (NLC) controllers from HONEYWELL INTERNATIONAL INC.

The one or more controllers 120 include any suitable structure(s) for controlling operation of one or more choke valves. A controller 120 could be implemented using hardware or a combination of hardware and software/firmware instructions. In this example, a controller 120 includes at least one processing unit 122, at least one memory unit 124, and at least one network interface 126. The at least one processing unit 122 includes any suitable processing structure(s), such as at least one microprocessor, microcontroller, digital signal processor, application specific integrated circuit, or field programmable gate array. The at least one memory unit 124 includes any suitable volatile and/or non-volatile storage and retrieval device(s), such as at least one hard disk, optical storage disc, RAM, or ROM. The at least one network interface 126 includes any suitable structure(s) for communicating over one or more networks, such as at least one wired Ethernet interface or wireless interface. Note, however, that this represents one specific way in which the controller 120 can be implemented.

The controller 120 is coupled to at least one network 128, which facilitates communication between components of system 100. The network 128 represents any suitable network or combination of networks facilitating communication between components in the system 100. The network 128 could, for example, represent a wired or wireless Ethernet network, an electrical signal network (such as a HART or FOUNDATION FIELDBUS network), a pneumatic control signal network, an optical network, or any other or additional network(s). As a particular example, the network 128 could be used to support communications between the controller 120 and choke valve actuators 152.

Although FIGS. 1A and 1B illustrate one example of an oil and gas production system 100, various changes may be made to FIGS. 1A and 1B. For example, as noted above, the technique implemented by the controller 120 for controlling one or more choke valves 106 can be used with any other suitable system, such as a system for producing substantially only natural gas. Also, the arrangement and functional division shown in FIGS. 1A and 1B are for illustration only. Various components in FIGS. 1A and 1B could be combined, further subdivided, rearranged, or omitted and additional components can be added according to particular needs.

FIG. 2 illustrates an example method 200 for increasing recovery of natural gas according to this disclosure. In general, the method 200 can be implemented using one or more controllers 120 to help increase or even maximize production of natural gas from one or more production wells. For ease of explanation, the method 200 is described with respect to the production system 100 of FIG. 1. However, the method 200 could be used with any other suitable production system, such as a system for producing substantially only natural gas.

As shown in FIG. 2, at least one model of a production system that outputs natural gas is generated and calibrated at step 202. This can be done, for example, using current and/or historical measurements associated with the production system 100. An optimal solution is identified using the model at step 204. This could include, for example, determining the optimal production rate or choke valve setting for each of one or more production wells 102. The optimal solution is implemented at step 206, such as by adjusting the choke valve 106 for each well 102 to achieve the desired optimal production rate or choke valve setting. The choke valve 106 can be adjusted in any suitable manner, such as by outputting a control signal to the valve actuator 152.

In step 202, a mathematical model of one or more wells 102 in a production network can be generated and calibrated using any suitable data. In some embodiments, a model can be generated using geological data. Example geological data could include well depth, degree of fracturing, amount and physical characteristics of proppants, and history of initial measurements (such as pressure, temperature, shale gas, and water production). In other embodiments, a simpler model that relies on normal operating data (such as historical or current production data) can be used, rather than geological data or parameters, to construct a model. Note, however, that any suitable data or combination of data (such as geological data and normal operating data) can be used to generate a model. In particular embodiments, this information is used to configure and calibrate a mathematical optimization model. The mathematical model could be a multi-period, non-linear, dynamic optimization model, such as a model that is configurable in a HONEYWELL PROFIT NLC controller.

In step 204, as noted above, an optimal solution could be defined in various ways, such as in terms of the optimal production rate or the optimal choke setting for a well. During step 204, a mathematical algorithm can be executed to find the near or most profitable production rate(s) or choke valve setting(s) for each well 102 over a specified optimization time horizon using the previously-generated model. The optimization time horizon could be in the one- to three-year range, but it could be more or less. In particular embodiments, the mathematical algorithm could be a differential/algebraic optimization algorithm, such as is embodied in a HONEYWELL PROFIT NLC controller. Also, in particular embodiments, a differential/algebraic optimization solver is used for solving the mathematical optimization model and determining the optimum solution for the model.

In step 206, the solution is implemented, such as by using a multi-variable model predictive control (MPC) controller like a HONEYWELL PROFIT controller. The multi-variable MPC controller can serve various functions, such as implementing the optimal production rate or optimal choke setting while monitoring and controlling various process variables. In particular embodiments, step 206 could include reviewing all on-line measurements and selecting a set of manipulated variables, controlled variables, and disturbance variables; designing a multi-variable MPC controller; and configuring the multi-variable MPC controller.

These steps 202-206 could be implemented in a variety of ways. First, the steps 202-206 could be executed in a fully automatic manner (on-line closed-loop mode) that would require no operator intervention other than turning on the controller(s) and defining any limits for process variables. Second, the steps 202-206 could be executed in a semi-automatic manner (on-line open-loop mode), where steps 202-204 are executed automatically and the optimal solution is presented to an operator for implementation after the operator or a supervisor has approved the solution. Third, the steps 202-206 could be executed in a partially automated manner (on-line advisory mode) that would automatically execute the steps 202-204 and provide the optimal solution to operations staff as an advisory notification, but it would not automatically implement the solution. Fourth, the steps 202-204 could be executed in an off-line manner (off-line advisory mode), and the optimal solution can be provided to the operations staff as an advisory notification. In this fourth scenario, the steps 202-204 could be executed on a device or system that is separate or remote from the computer system controlling the production system 100.

In particular embodiments, a computer system could be used to implement this functionality, such as a control system forming a part of a production system-wide computer network. After installation of the components, the installed control system can be tested and made operational in one of the previously-mentioned modes (on-line closed loop, on-line open loop, on-line advisory, or off-line advisory mode).

As noted above, one or more models can be used to control the choke valve(s) 106 of the production well(s) 102. In particular embodiments, a model can be derived as follows, using either mass balances or standard volumetric unit balances. The following assumes that a shale reservoir is being modeled, although the same or similar calculations can be made with other tight gas reservoirs.

A reservoir with volume $V_R$ is modeled as a continuous stirred bed with a rock or shale void fraction $\epsilon$. The shale contains gas (adsorbed phase) and is initially in equilibrium with the gas in the reservoir void space at a given pressure. When a concentration gradient exists, the gas in the shale phase desorbs and transfers into the void space by a mass transfer mechanism. The mass transfer coefficient can be pressure-dependent to reflect the low permeability conditions for low pressures. The model may also account for water in the gas stream so that constraints on water loading can be handled in the production optimization problem.

The mass balance for the gas in the reservoir void space can be expressed as:

$$\frac{dm_G}{dt} + F_G - \frac{dm_A}{dt} = 0.$$

The holdup of mass (with density $\rho_G$) in the void space can be expressed as:

$$m_G = \epsilon V_R \rho_G.$$

The gas mass flow rate $F_G$ from the well can be determined using the following flow equation:

$$F_G = C_V \sqrt{\Delta P_e \rho_G}.$$

$C_V$ is related to the choke valve position, depending on the characteristic equation selected for the valve:

$$C_V = C_V^{max} f(\alpha).$$

For a linear choke valve 106, the $f(\alpha)$ function can be expressed as:

$$f(\alpha) = \frac{\alpha}{100}.$$

The effective delta P ($\Delta P_e$) can be determined as the minimum of the actual pressure drop $\Delta P$ and the critical pressure drop $\Delta P_c$:

$$\Delta P_e = \min(\Delta P, \Delta P_c)$$

$$\Delta P = P_R - P_D$$

$$\Delta P_c = \theta P_R.$$

The variable $\theta$ is a function of the gas heat capacity ratio and can be defined as:

$$\theta = \gamma \left(\frac{2}{\gamma+1}\right)^{\frac{\gamma+1}{\gamma-1}}$$

$$\gamma = \frac{C_p}{C_v}.$$

The dynamic mass balance for the gas in the adsorbed phase can be derived as follows. First, the holdup of gas in the shale/rock can be expressed as:

$$m_A = N_A \rho_B (1-\epsilon) V_R \rho_G^0.$$

In this equation, $N_A$ is the concentration of the gas in the adsorbed phase in standard volumetric units per unit mass of shale/rock, and $\rho_G^0$ is the gas density at standard conditions. The rate of change of gas adsorbed in the shale can be found by differentiating the above equation:

$$\frac{dm_A}{dt} = \frac{dN_A}{dt} \rho_B (1-\varepsilon) V_R \rho_G^0.$$

The fractured shale gas bulk density $\rho_B$ can be related to the fractured shale porosity $\phi$, adsorbed gas density $\rho_G$, and shale material density $\rho_S$ as follows:

$$\rho_B = \phi \rho_G + (1-\phi) \rho_S.$$

The rate of change of the gas volume holdup per unit mass of shale can be defined by the following mass transfer model:

$$\frac{dN_A}{dt} = k(N_E - N_A).$$

The mass transfer coefficient may be pressure-dependent to reflect the reduction in mass transfer from the adsorbed phase and the void phase due to pressure-dependent permeability effects. The mass transfer coefficient equation can be expressed as:

$$k(P) = k_0 e^{-k_1 \frac{P_{ref}}{P}}.$$

The equilibrium specific volume $N_E$ can be determined using a Langmuir isotherm, and the single site form can be expressed as:

$$N_E = \frac{V_L P}{P_L + P}.$$

By plotting the gas content versus pressure for a gas well, the desorption of gas from shale can be seen, and the Langmuir adsorption parameters $V_L$ and $P_L$ can be derived from the plot. A value $V_L$ may represent the asymptotic value of the gas content as pressure increases to infinity. A value $P_L$ may represent the value of pressure at which 50% of the $V_L$ value is obtained.

The model that is ultimately created may be generally expressed in a non-linear, implicit differential/algebraic equation form. For example, the model may be generally expressed as:

$$f(\dot{x}, x, u, t) = 0$$

where x represents integrated variables such as production rate, $\dot{x}$ represents the time derivative of x, u represents manipulated or other algebraic variables such as choke setting and reservoir pressure, and t represents time.

By using one or more controllers 120 to implement the optimal solution for the model as described above, the position of a choke valve 106 can be dynamically adjusted over time. An example of this is shown in FIG. 3, which illustrates an example graph 300 plotting choke valve position (vertical) over time (horizontal) according to this disclosure. As shown here, the valve position remains in its initial position for 30 days, followed by regular adjustments at a 30-day interval. Of course, adjustments could be made more or less frequently.

Although FIG. 2 illustrates one example of a method 200 for increasing recovery of natural gas, various changes may be made to FIG. 2. For example, the method 200 could be implemented using any suitable controller or combination of controllers for any suitable production system. Also, while shown as a series of steps, various steps in FIG. 2 could overlap, occur in parallel, or occur multiple times. Although FIG. 3 illustrates one example of a graph 300 plotting choke valve position over time, various changes may be made to FIG. 3. For instance, the behavior shown in FIG. 3 is for illustration only.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
    obtaining a model associated with production of natural gas from a well, the well having a choke valve that controls flow of material including natural gas from the well;

identifying, using the model, a solution that increases an amount of natural gas obtained from the well over a specified time horizon; and adjusting operation of the choke valve based on the identified solution;

wherein the model models a natural gas reservoir as a continuous stirred bed with a rock or shale void fraction.

2. The method of claim 1, wherein identifying the solution comprises at least one of:

identifying an optimal production rate for the well; or identifying an optimal choke valve setting for the well.

3. The method of claim 1, wherein identifying the solution comprises determining how to adjust the choke valve to maximize natural gas production over the specified time horizon, the specified time horizon being at least one year in length.

4. The method of claim 1, wherein obtaining the model comprises generating the model using at least one of: geological data associated with the well or historical data associated with natural gas production from the well.

5. The method of claim 1, wherein obtaining the model comprises generating the model using mass or volumetric unit balances.

6. The method of claim 5, wherein generating the model further comprises plotting gas content versus pressure for the well and identifying Langmuir adsorption parameters for the well using the plotted gas content versus pressure.

7. The method of claim 1, wherein adjusting the operation of the choke valve comprises adjusting an opening of the choke valve using a valve actuator.

8. An apparatus comprising:

at least one memory device configured to store a model associated with production of natural gas from a well that has a choke valve for controlling flow of material including natural gas from the well; and at least one processing device configured to:

identify, using the model, a solution that increases an amount of natural gas obtained from the well over a specified time horizon; and adjust operation of the choke valve based on the identified solution;

wherein the model models a natural gas reservoir as a continuous stirred bed with a rock or shale void fraction.

9. The apparatus of claim 8, wherein the at least one processing device is configured to identify the solution by at least one of:

identifying an optimal production rate for the well; or identifying an optimal choke valve setting for the well.

10. The apparatus of claim 8, wherein the at least one processing device is configured to identify the solution by determining how to adjust the choke valve to maximize natural gas production over the specified time horizon, the specified time horizon being at least one year in length.

11. The apparatus of claim 8, wherein the at least one processing device is configured to generate the model using at least one of: geological data associated with the well or historical data associated with natural gas production from the well.

12. The apparatus of claim 8, wherein the at least one processing device is configured to generate the model using mass or volumetric unit balances.

13. The apparatus of claim 12, wherein the at least one processing device is configured to generate the model further by plotting gas content versus pressure for the well and identifying Langmuir adsorption parameters for the well using the plotted gas content versus pressure.

14. The apparatus of claim 8, wherein the at least one processing device is configured to adjust the operation of the choke valve by interacting with a valve actuator that is configured to adjust an opening of the choke valve.

15. A non-transitory computer readable medium embodying a computer program, the computer program comprising computer readable program code for:

obtaining a model associated with production of natural gas from a well having a choke valve that controls flow of material including natural gas from the well;

identifying, using the model, a solution that increases an amount of natural gas obtained from the well over a specified time horizon; and adjusting operation of the choke valve based on the identified solution wherein the model models a natural gas reservoir as a continuous stirred bed with a rock or shale void fraction.

16. The computer readable medium of claim 15, wherein the computer readable program code for identifying the solution comprises computer readable program code for at least one of:

identifying an optimal production rate for the well; or identifying an optimal choke valve setting for the well.

17. The computer readable medium of claim 15, wherein the computer readable program code for identifying the solution comprises computer readable program code for determining how to adjust the choke valve to maximize natural gas production over the specified time horizon, the specified time horizon being at least one year in length.

18. The computer readable medium of claim 15, wherein the computer readable program code for obtaining the model comprises computer readable program code for generating the model using at least one of: geological data associated with the well or historical data associated with natural gas production from the well.

19. The computer readable medium of claim 15, wherein:

the computer readable program code for obtaining the model comprises computer readable program code for generating the model; and the computer readable program code for generating the model comprises computer readable program code for using mass or volumetric unit balances.

20. The computer readable medium of claim 19, wherein the computer readable program code for generating the model comprises computer readable program code for plotting gas content versus pressure for the well and identifying Langmuir adsorption parameters for the well using the plotted gas content versus pressure.

* * * * *